United States Patent [19]

WONG et al.

[11] Patent Number: 4,933,577
[45] Date of Patent: Jun. 12, 1990

[54] OUTPUT CIRCUIT FOR A PROGRAMMABLE LOGIC ARRAY

[75] Inventors: Silg Y. Wong, Sunnyvale; John M. Birkner, Portola Valley, both of Calif.

[73] Assignee: Advanced Micro Devices, Inc., Sunnyvale, Calif.

[21] Appl. No.: 336,628

[22] Filed: Apr. 10, 1989

Related U.S. Application Data

[60] Continuation of Ser. No. 8,458, Jan. 28, 1987, abandoned, which is a division of Ser. No. 715,214, Mar. 22, 1985, Pat. No. 4,684,830.

[51] Int. Cl.$^5$ .................. H03K 19/173; G06F 7/38
[52] U.S. Cl. .................. 307/465; 307/243; 328/105
[58] Field of Search .......... 307/465, 466, 243; 328/105; 364/491, 716; 365/96; 340/825.8, 825.88, 825.83, 825.85

[56] References Cited

U.S. PATENT DOCUMENTS

| | | | |
|---|---|---|---|
| 4,422,072 | 12/1983 | Cavlan | 307/465 |
| 4,609,986 | 9/1986 | Hartmann et al. | 364/200 |
| 4,617,479 | 10/1986 | Hartmann et al. | 307/465 |
| 4,684,830 | 8/1987 | Tsui et al. | 307/465 |
| 4,717,912 | 1/1988 | Harvey et al. | 307/465 |

FOREIGN PATENT DOCUMENTS 0198677  10/1986  European Pat. Off. .

OTHER PUBLICATIONS

Programmable Array Logic PAL20RA10, Monolithic Memories Inc. data manual, 1985.
AMPAL 22V10 Advanced Micro Devices, Inc., 1984.
"The PAL 20RA10 Story-the Customization of a Standard Product," Baker et al., IEEE Micro, Oct. 1986, pp. 45-60.

*Primary Examiner*—Stanley D. Miller
*Assistant Examiner*—Richard Roseen
*Attorney, Agent, or Firm*—Skjerven, Morril, MacPherson, Franklin

[57] ABSTRACT

An output circuit (50) is provided for a programmable logic array (PLA) integrated circuit. The output circuit (50) includes a flip flop (52) which stores a given output term from the array. The flip flop (52) contains a set input lead (S) and a reset input lead (R). The signals present at the set input, reset input, and clock leads are generated by programmable logic within the PLA. A multiplexer (54) is provided which receives the output data of the flip flop (52) and the signal constituting the input data for the flip flop. The multiplexer provides the data input signal on the multiplexer output lead (60) when both the set and reset input signals are true. However, if either or both the set and reset input signals are false, then the multiplexer (54) provides the Q output signal from the flip flop (52) on the multiplexer output lead (60). The multiplexer output signal is presented to a three-state buffer (62) which in turn drives an output pin.

8 Claims, 4 Drawing Sheets

FIG._2a. (PRIOR ART)
FIG._2b. (PRIOR ART)
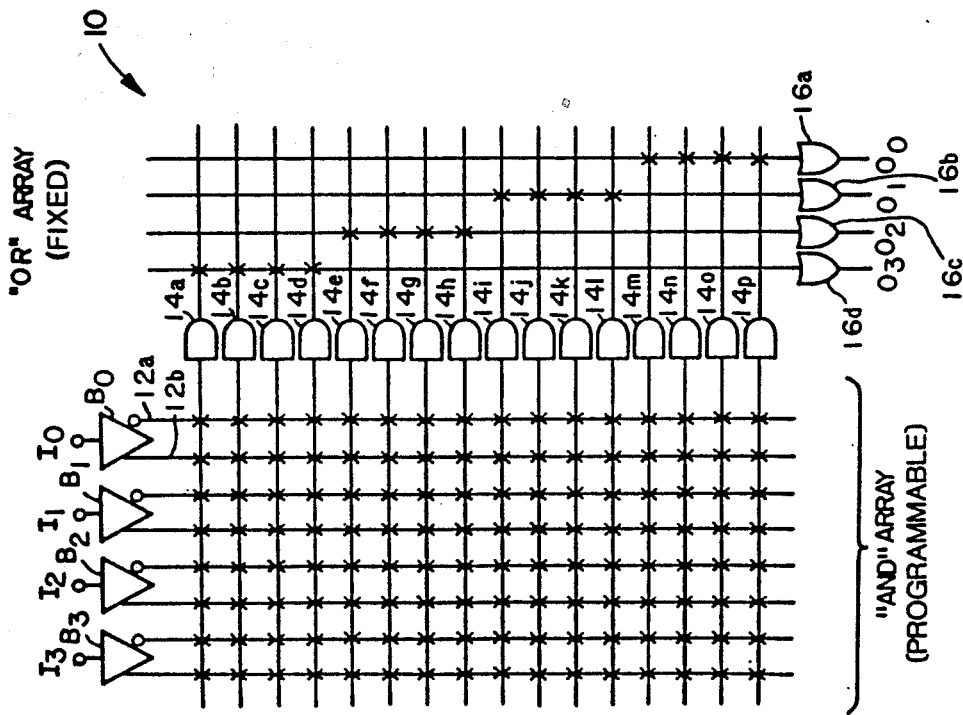
FIG._1. (PRIOR ART)

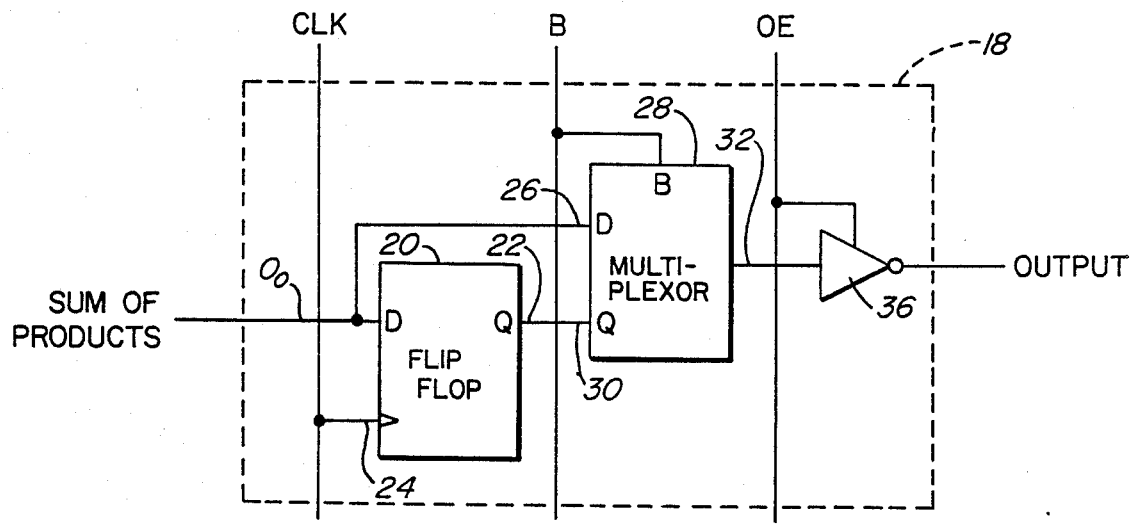
FIG._3.
(PRIOR ART)
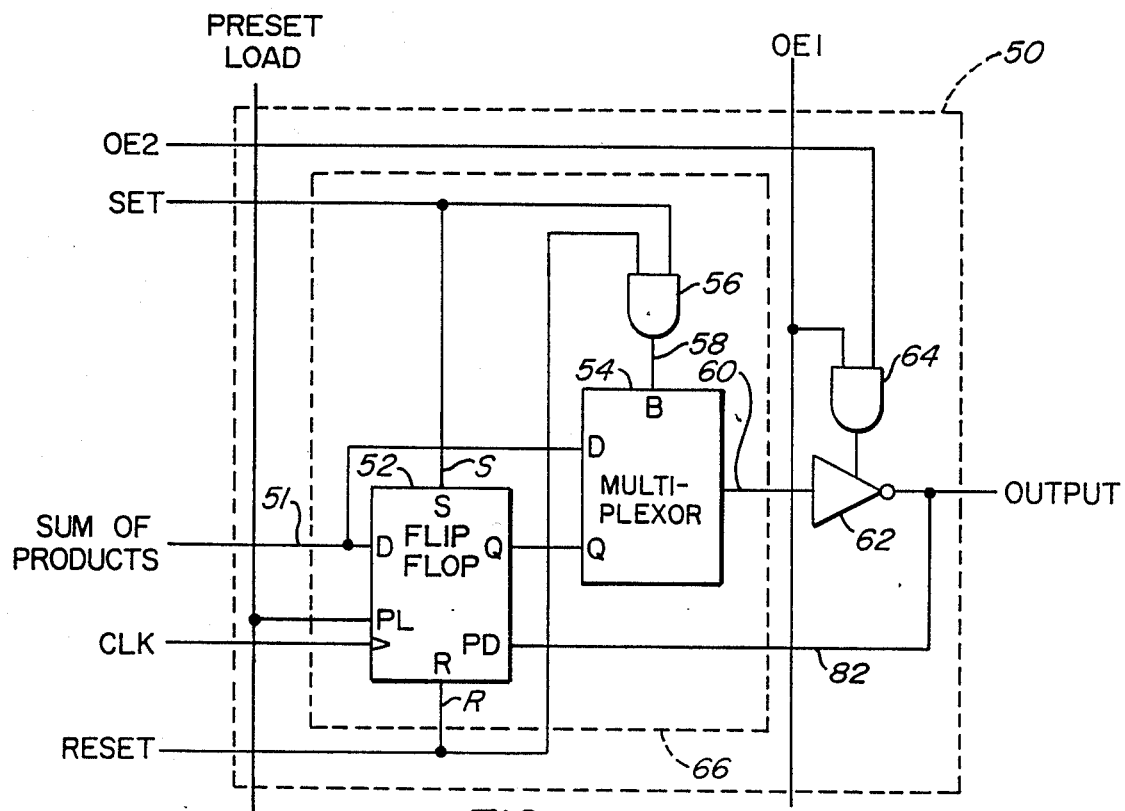
FIG._4.

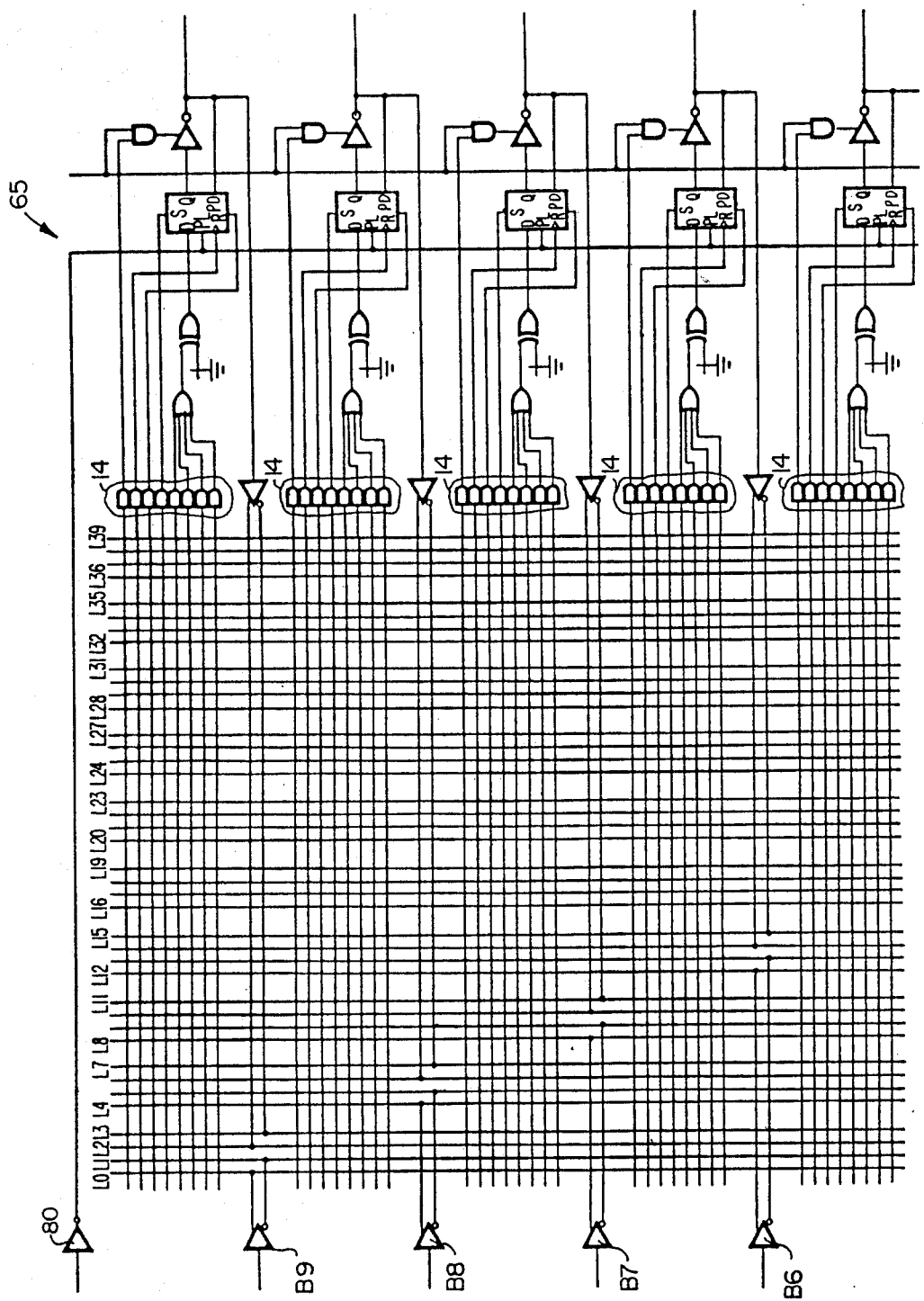
FIG._5-1.

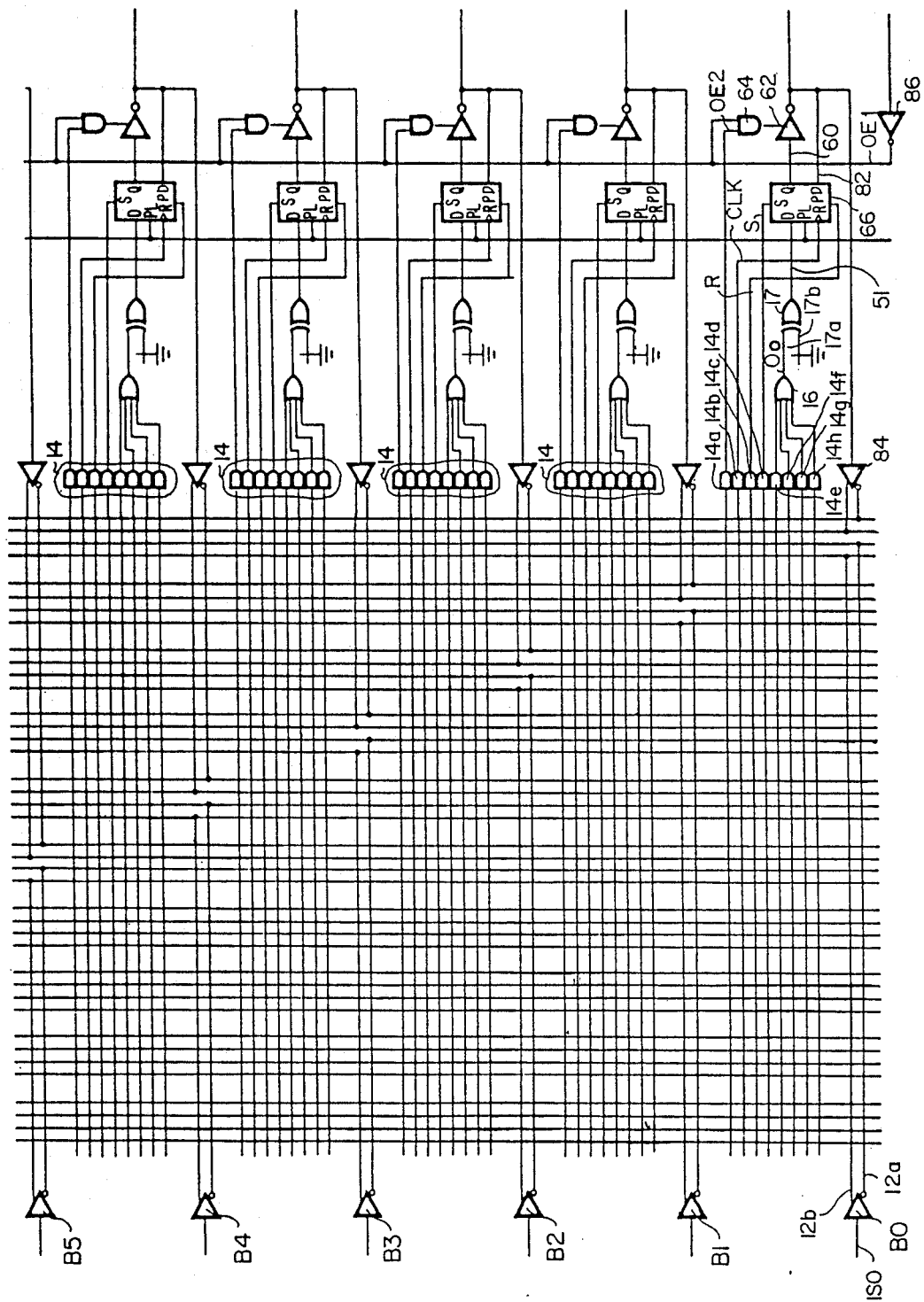
FIG._5-2.

OUTPUT CIRCUIT FOR A PROGRAMMABLE LOGIC ARRAY

This application is a continuation of application Ser. No. 07/008,458 now abandoned, filed 01/28/87 which is a division of application Ser. No. 06/715,214, filed 03/22/85, now U.S. Pat. No. 4,684,830.

BACKGROUND OF THE INVENTION

This invention relates to logic circuits using registers and to output circuits for programmable logic array (PLA) circuits. PLA circuits are well known in the art. A description of PLA circuits can be found in *PAL Programmable Array Logic Handbook* published by Monolithic Memories, Inc., the assignee of this application. PAL is a registered trademark of Monolithic Memories, Inc., the assignee of this application. FIG. 1 illustrates a simple PLA circuit 10. Included in circuit 10 are four input terminals I0, I1, I2, and I3. Each input terminal I0 through I3 is coupled to the input lead of a buffer B0 through B3. Each buffer has an inverting output lead and a noninverting output lead. For example, buffer B0 has an output lead 12a which provides a signal $\overline{IS0}$, which is the inverse of the signal present on terminal I0. Similarly, buffer B0 has an output lead 12b, which provides a signal IS0, which is equal to the signal present at terminal I0. Each of the output signals from buffers B0 to B3 are presented as an input signal to an AND gate 14a. AND gate 14a is an 8 input AND gate, and each of the output leads of buffers B0 to B3 is uniquely coupled to a single input lead of AND gate 14a. Thus, FIG. 2a illustrates the eight input leads to AND gate 14a. FIG. 2b illustrates AND gate 14a using the more conventional notation. In addition, fifteen other AND gates, 14b to 14p are also provided and are connected to the output leads of buffer B0 through B3 in the same manner as AND gate 14a. Thus, each of AND gates 14a–14p is coupled to all eight output leads of buffers B0 to B3. However, a purchaser of a PLA circuit has the option of severing the connection between a given buffer output lead and a given AND gate 14a to 14p. This is done by opening a fuse similar to the fuses employed in programmable read only memories. In this way, the user can cause each AND gate 14a through 14p to provide a unique output signal dependent on a particular set of input signals.

Also as can be seen in FIG. 1, a first OR gate 16a includes four input leads coupled to AND gates 14m, 14n, 14o, and 14p. OR gate 16a generates an output signal on an output lead $O_0$ therefrom. Similarly, an OR gate 16b receives output signals from AND gates 14i, 14j, 14k and 14l and generates an output signal on a lead $O_1$ therefrom. The output signals from OR gate 16c and 16d are similarly derived from the remaining AND gates. (Unlike the input leads of AND gates 14a to 14p, the input leads of OR gates 16a to 16d are fixed, i.e., they cannot be programmed by opening fuses.) In this way, a programmable logic circuit 10 is provided which provides arbitrary programmable Boolean functions which can be used in a variety of applications. A programmable logic circuit which provides "arbitrary programmable Boolean functions" is one which can be programmed by the system designer to provide any of a number of Boolean functions required in a given system design. This semicustom circuit provides an inexpensive replacement for a large number of TTL circuits which would otherwise be required. As is also known in the art, different numbers of input terminals and different numbers of output terminals are provided by different generic types of PLA circuits such as model number PAL 10A8 and model number PAL 12H6, both manufactured by Monolithic Memories, Inc.

It is also known in the art to provide a logic array in which the input leads to the OR gates are programmable. For example, it is known to provide an array such as the one in FIG. 1, except that the output lead from each AND gate 14a through 14p is programmably connected to OR gates 16a through 16d. The term "PLA" in this patent includes devices having OR gates with fixed inputs and programmable inputs.

An improvement of the circuit of FIG. 1 is illustrated in the prior art circuit of FIG. 3. In FIG. 3, each of the output leads of OR gates 16a through 16d are coupled to a circuit such as circuit 18 of FIG. 3. FIG. 3 illustrates the output circuit coupled to output lead $O_0$. However, it is understood that all of the output leads $O_0$ through $O_3$ are coupled to identical circuits. Output lead $O_0$ is coupled to a D flip flop 20 and a first input lead 26 of a multiplexer 28. The Q output lead 22 of flip flop 20 is connected to a second input lead 30 of multiplexer 28. An output lead 32 of multiplexer 28 is coupled to the input lead of an inverting three-state buffer 36. As is well known in the art, a three-state buffer is a buffer which can drive an input lead with a logical high signal or drive the output lead with a logical low signal or go into a high impedance mode whereby the tri-state buffer is not driving the output lead at all. The clock input lead 24 of flip flop 20 is controlled by a clock line CLK which also provides the clock input signals for the D flip flops that are coupled to output leads $O_1$ to $O_3$ (not shown). The CLK line is driven by a dedicated pin on the PLA integrated circuit. The select control for multiplexer 28 is controlled by a select line B which also controls the state of multiplexers coupled to output leads $O_1$ through $O_3$ (not shown). Finally, an output enable line OE (driven by a dedicated pin on the PLA integrated circuit or from combinatorial logic within the array) determines when output buffer 36 goes into the high impedance mode. Output line OE also controls the other output buffers coupled to output leads $O_1$ to $O_3$ (not shown).

In operation, clock line CLK causes the information on output lead $O_0$ to be stored in flip flop 20. Select line B determines whether the information on output lead $O_0$ or the information stored in flip flop 20 will be presented to buffer 36. The state of select line B is determined by a select fuse (not shown) located within the integrated circuit. Thus, the user programming PLA 10 determines whether the signal on output lead $O_0$ is presented to buffer 36 or whether the data stored in flip flop 20 is presented to buffer 36. Since this selection is made by blowing a fuse, it is irreversible. The configuration of FIG. 3 has several other disadvantages. For example, each output circuit 18 cannot be individually configured in the registered or combinatorial mode, i.e., once select line B is set, it is set for all the output circuits coupled to output leads $O_0$ through $O_3$.

SUMMARY

A PLA circuit includes an output circuit coupled to the output leads of the OR gates. This circuit includes a D flip flop having set and reset input leads. These set and reset input leads control the state of a multiplexer coupled to the flip flop such that when the set and reset input signals are both in the high state, an input signal to the multiplexer causes the output signal from the OR gates to be selected as an input signal to a three-state output buffer. However, when one or both of the set and reset input signals are in the low state, the D flip flop is selected as the source of the input signal for the three-state buffer. The set and reset signals are generated by the programmable logic within the PLA circuit. In this way, the PLA circuit can selectively provide registered or nonregistered output data. An important feature of this invention is that this selection is reversible. In addition, the clock signal for the D flip flop is also generated from programmable logic within the PLA circuit. The flip flop also includes a preload input lead and an additional input lead coupled to the output lead of the three-state output buffer. The flip flop stores the data present at the additional input lead in response to a signal at the preload input lead.

BRIEF DESCRIPTION OF THE DRAWINGS

FIG. 1 is a schematic diagram of a PLA circuit constructed in accordance with the prior art;

FIG. 2a is a schematic diagram of an eight input AND gate using the notation employed in FIG. 1;

FIG. 2b is a schematic diagram of the AND gate of FIG. 2a using more conventional notation;

FIG. 3 is an output circuit used with a PLA circuit constructed in accordance with the prior art;

FIG. 4 is a schematic diagram of an output circuit for use with a PLA circuit constructed in accordance with the present invention;

FIGS. 5-1 and 5-2 are is a schematic diagram of a PLA circuit constructed in accordance with the present invention; and FIG. 5 illustrates the manner in which FIG. 5-1 and FIG. 5-2 are to be placed relative to one another.

DETAILED DESCRIPTION

In accordance with an embodiment of the invention, FIG. 4 illustrates a novel output circuit 50 which includes an input lead 51. The signal on input lead 51 is provided by an OR gate from an array similar to the array of FIG. 1. Input lead 51 is coupled to a D flip flop 52 and a multiplexer 54. Flip flop 52 has a reset input lead R and a set input lead S. The signals on leads S and R are generated from programmable logic within the PLA as discussed below. When the signal on input lead S is in a high state, flip flop 52 is set. When the signal on input lead R is in a high state, flip flop 52 is reset. When the input signal on input lead S and input lead R are in a low state, flip flop 52 remains in an unchanged state. However, when the signal present on input lead S and input lead R are simultaneously high, flip flop 52 is in an indeterminable state. The effect of the signals on leads S and R are summarized in Table I below:

TABLE I

| S | R | State of Flip Flop 52 | Data Present on Lead 60 |
|---|---|---|---|
| 0 | 0 | Unchanged | Q data output from flip flop 52 |
| 1 | 0 | Q = 1 | Q (which equals 1) |
| 0 | 1 | Q = 0 | Q (which equals 0) |
| 1 | 1 | Indeterminable | Signal present on lead 51 |

Flip flop 52 is also coupled to a clock line CLK. If the signals on leads S and R are low, when the signal on line CLK goes high, flip flop 52 stores the data present on lead 51. In a preferred embodiment, the signal on line CLK is generated by programmable logic within the PLA circuit as described below.

Input lead S and input lead R are each coupled to an AND gate 56. An output lead 58 of AND gate 56 is coupled to the select line input lead of multiplexer 54. When the signals on input lead S and input lead R are both high, the output signal on output lead 58 goes high, causing multiplexer 54 to provide the signal present on input lead 51 on a multiplexer output lead 60. If the output lead signal on output lead 58 is low, then multiplexer 54 provides the Q output signal from flip flop 52 on output lead 60. This novel arrangement permits the designer to selectively apply the signal on lead $O_0$ or the Q output data from flip flop 52 to output lead 60. The advantage of using AND gate 56 to select the source of data for multiplexer 54 is that the selection is not irreversible, as it is when one blows a fuse to make that selection (as is done in the prior art). Output lead 60 is coupled to a three-state inverting buffer 62. The output signal from an AND gate 64 determines whether three-state buffer 62 goes into the high impedance mode or low impedance mode. AND gate 64 is controlled by an input signal OE1 and an input signal OE2. In one embodiment of the invention input signal OE1 is provided by a dedicated input pin in the PLA integrated circuit and input signal OE2 is generated by programmable logic (e.g., AND gates having programmable input leads) within the PLA integrated circuit. Input signal OE1 is also coupled to the corresponding AND gates in the output circuits coupled to the other OR gates of the PLA circuit (as described below) while signal OE2 is uniquely coupled to AND gate 64.

An illustration of a PLA circuit 65 incorporating the present invention is illustrated in FIGS. 5-1 and 5-2. Referring to a set of ten data input buffers B0 through B9 are driven by dedicated pins of the integrated circuit. Buffer B0 has an output lead 12a and an output lead 12b. As was the case in the previous embodiment, buffer B0 drives output lead 12b with the signal IS0 present at the input lead of buffer B0. Similarly, buffer B0 drives output lead 12a with $\overline{IS0}$. Lead 12b is coupled to a line L36 and lead 12a is coupled to a line L37. The output leads of buffers B1 to B10 are similarly connected to lines L0, L1, L4, L5, L8, L9, etc. Each of lines L0 through L39 are connected to a single input lead of each of eighty 40-input lead AND gates generally designated as 14. Eight of those AND gates are designated as AND gates 14a through 14h. A description of the manner in which AND gates 14a through 14h are electrically connected within the PLA circuit is given below, it being understood that the remainder of AND gates 14 are connected in a similar manner. As described above, each line L0 through L39 is connected to a unique input lead of Q each AND gate 14. By blowing appropriate fuses, any or all of lines L0 through L39 can be electrically connected to any of the AND gates 14. As is well known in the art, when a large amount of current is passed through a fuse, such as a polycrystalline silicon fuse, the electrical connection between the nodes connected by the fuse is severed. When this has happened, the fuse is "blown". In this way, arbitrary Boolean functions are provided by the PLA circuit of FIGS. 5-1 and 5-2. AND gates 14e to 14h drive input leads of OR gate 16. OR gate 16 has an output lead $O_0$ coupled to a first input lead 17a of an exclusive OR gate 17. A second lead 17b of exclusive OR gate 17 is illustrated as being coupled to ground. Lead 17b can be selectively coupled to ground or coupled to a digital high state depending on the state of a fuse (not shown) which can be blown. In that way, exclusive OR gate 17 can either provide the signal on output lead $O_0$ (when lead 17b is coupled to ground) or an inverted version of the signal present on lead $O_0$ (when lead 17b is coupled to the digital high state) to the data input line of combination flip flop multiplexer 66.

It is seen in FIG. 5-2 that AND gate 14a drives input lead OE2 of AND gate 64. AND gate 64 of FIG. 5-2 performs the same function as AND gate 64 of FIG. 4. AND gate 14b provides the clock signal on clock line CLK for combination flip flop multiplexer 66 and AND gate 14c drives lead R of combination flip flop multiplexer 66 and AND gate 14d drives lead S of combination flip flop multiplexer 66. In this way, the clock, set, and reset functions of combination flip flop multiplexer 66 are all provided by programmable logic. An example of how this may be done is as follows. Signals IS0 through IS9 are presented at the input leads of buffers B0 through B9. If it is desired to have the signal on line R equal to the signal IS9·IS8, one would disconnect AND gate 14c from lines L1 to L3 and L5 to L39 by blowing the appropriate fuses. This would leave AND gate 14c having two input leads: one coupled to line L0 and one coupled to line L4. AND gate 14c would then provide the signal IS9·IS8 on lead R. This novel arrangement permits the designer a greater degree of flexibility when designing circuits for driving reset lead R, set lead S, and clock lead CLK. Instead of requiring dedicated pins or external logic circuits to provide signals on leads S, R, and CLK, these lines can be driven by programmable logic within PLA circuit 65 itself. Combination flip flop multiplexer 66 functions in the same way as flip flop 52 and multiplexer 54 of FIG. 4. When lead S and lead R are both high, circuit 66 drives output lead 60 with the signal provided by exclusive OR gate 17. If lead S and lead R are not in the high state, then data from the flip flop within circuit 66 is provided on output lead 60.

Circuit 66 also includes a preload input lead PL which is driven by a buffer 80. Buffer 80 in turn is driven by an external pin of PLA circuit 65. When the signal on input lead PL goes high, the data present at an input line 82 is stored in the flip flop within circuit 66. The data on lead 82 can be provided by either buffer 62, or if buffer 62 is in the tri-state mode, by drivers external to the PLA circuit (not shown). In this way, the data output pins of PLA circuit 65 are bi-directional, and a data bus external to PLA circuit 65 coupled to buffer 62 can provide data to the PLA circuit. In addition, the output lead of buffer 62 is coupled to a buffer 84. Buffer 84 drives lines L38 and L39, respectively, with data corresponding to the signal present at the output lead of buffer 62 and an inverted version of that data. In that way, programmable feedback loops are provided within PLA circuit 65. In addition, when buffer 62 is in the three-state mode, data from an external driver can provide input data for buffer 84.

As is apparent from the schematic diagram of FIGS. 5-1 and 5-2, a buffer 86 provides the OE1 signal described in conjunction with FIG. 4. The input lead of buffer 86 is coupled to a pin of PLA circuit 65.

In summary, a novel PLA circuit has been described having an output circuit which can selectively provide registered output data or nonregistered output data. This selection is made in response to PLA data input signals. The PLA circuit uses a D flip flop having set, reset, and clock input leads. The signals provided on the set, reset, and clock input leads are all driven by programmable logic within the PLA circuit to provide greater design flexibility than previously available in the prior art.

While the invention has been described with reference to a particular embodiment, those skilled in the art will realize that minor modifications can be made to form in detail without departing from the spirit and scope of the invention. For example, the integrated circuit disclosed herein could be constructed using an MOS or bipolar technology. Similarly, a different size array could be employed. In addition, flip flops adapted to remain in an unchanged state when both the set and reset input signals are high could be used. One skilled in the art will also appreciate that the circuit of this invention could be implemented using active high or active low elements. Accordingly, all such modifications come within the scope of this invention as delineated by the following claims.

I claim:

1. A PLA comprising:
   means for providing a plurality of input signals;
   means for providing a plurality of intermediate signals corresponding to the logical product of at least some of said input signals;
   means for providing a plurality of output signals corresponding to the logical sum of at least some of said intermediate signals;
   an output lead;
   flip flop means having a first input lead coupled to receive one of said output signals and a second input lead coupled to said output lead for storing said one output signal and providing said one stored output signal on said output lead or for receiving a signal from said second input lead and for storing said signal received from said second input lead, and wherein said flip flop means includes a preset control line, said flip flop means storing the signal on said second input lead in response to a preset signal on said preset control line, said flip flop means also including a clock line, said flip flop means for storing said one output signal in response to a clock signal on said clock line.

2. The PLA of claim 1 wherein in said flip flop means comprises a three state buffer for receiving the signal stored in said flip flop means and providing said signal stored in said flip flop means on said output lead, said three state buffer including a three state control input, said three state buffer going into a high impedance mode in response to a three state control signal being applied to said three state control input.

3. The PLA of claim 1 further comprising means for providing the signal on said output lead as one of said input signals.

4. A circuit comprising:
   a first input lead for receiving an input signal;
   an output lead;
   a second input lead for receiving a clock signal;
   storing means for receiving and storing said input signal in response to said clock signal on said second input lead;
   means coupled to said storing means and said output lead for providing the signal stored in said storing means on said output lead;
   a third input lead for receiving a control signal,
   said storing means storing a signal present at said output lead in response to said control signal.

5. The circuit of claim 4 wherein said means for providing comprises a three state buffer for receiving said stored input signal and providing said stored input signal on said output lead, said three state buffer having a three state control lead, said three state buffer going into a high impedance mode in response to a signal present on said three state control lead.

6. The circuit of claim 4 wherein said storing means is a flip flop having a clock lead and a preset control lead, said flip flop storing the signal at said first input lead in response to a signal on said clock lead, said flip flop storing the signal on said second input lead in response to the signal at said preset control lead.

7. The PLA of claim 1 wherein said circuit is constructed such that said flip flop means can store either said signal at said first input lead or the signal at said second input lead during normal operation.

8. Circuit of claim 4 wherein said circuit can store the signal at said first input lead or the signal at said output lead during normal operation.

* * * * *

UNITED STATES PATENT AND TRADEMARK OFFICE
CERTIFICATE OF CORRECTION

PATENT NO.  : 4,933,577

DATED       : June 12, 1990

INVENTOR(S) : Sing Y. Wong and John M. Birkner

It is certified that error appears in the above-identified patent and that said Letters Patent is hereby corrected as shown below:

On the patent title page, the first Inventor's name should read --Sing Y. Wong--.

On the patent cover page, the Law Firm name should read --Skjerven, Morril, MacPherson, Franklin & Friel--.

Col. 3, line 32, please delete "is".

Col. 4, line 35, after "Referring to" please insert --Figures 5-1 and 5-2,--.

Col. 4, line 43, "B1O" should read --B10--.

Col. 8, line 1, Claim 6, "second input" should read --output--.

Signed and Sealed this

Fifth Day of May, 1992

Attest:

DOUGLAS B. COMER

*Attesting Officer*    *Acting Commissioner of Patents and Trademarks*